(12) United States Patent
Ding

(10) Patent No.: US 11,419,242 B2
(45) Date of Patent: Aug. 16, 2022

(54) NEGATIVE PRESSURE LIQUID COOLING SYSTEM AND CONTROL METHOD FOR CONTROLLING NEGATIVE PRESSURE LIQUID COOLING SYSTEM

(71) Applicant: Huawei Technologies Co., Ltd., Guangdong (CN)

(72) Inventor: Junfeng Ding, Shenzhen (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 358 days.

(21) Appl. No.: 16/810,516

(22) Filed: Mar. 5, 2020

(65) Prior Publication Data

US 2020/0205315 A1 Jun. 25, 2020

Related U.S. Application Data

(63) Continuation of application No. PCT/CN2018/104063, filed on Sep. 5, 2018.

(30) Foreign Application Priority Data

Sep. 6, 2017 (CN) .......................... 201710796380.8

(51) Int. Cl.
*H05K 7/20* (2006.01)

(52) U.S. Cl.
CPC ..... *H05K 7/20272* (2013.01); *H05K 7/20254* (2013.01); *H05K 7/20281* (2013.01)

(58) Field of Classification Search
CPC .... F02D 19/027; B64D 33/08; H05K 7/20254

USPC ............................ 123/519, 489; 62/513, 175
See application file for complete search history.

(56) References Cited

U.S. PATENT DOCUMENTS

| 4,967,832 A | 11/1990 | Porter |
| 8,582,295 B2 | 11/2013 | Davis |
| 2008/0160246 A1* | 7/2008 | Buhler ................ H01L 23/3735 427/97.1 |
| 2009/0277333 A1* | 11/2009 | Sakurai ............... C01B 13/0259 96/150 |
| 2011/0253347 A1 | 10/2011 | Harrington |
| 2014/0124188 A1 | 5/2014 | Xu |

(Continued)

FOREIGN PATENT DOCUMENTS

| CA | 1185654 A | 4/1985 |
| CN | 102333433 A | 1/2012 |

(Continued)

*Primary Examiner* — Kiet M Doan
(74) *Attorney, Agent, or Firm* — Womble Bond Dickinson (US) LLP

(57) ABSTRACT

A negative pressure liquid cooling system and a method for controlling a negative pressure liquid cooling system are provided, and the negative pressure liquid cooling system separately controls pressures at an inlet and an outlet of a cold plate, so that the pressures at the inlet and the outlet of the cold plate remain negative. In this way, when a pipeline between the inlet and the outlet of the cold plate is perforated, a pressure at the outlet of the cold plate can be separately controlled to remain negative, so that a coolant is suppressed in the pipeline, and a coolant leakage phenomenon is avoided. Therefore, damage or a security threat to a to-be-cooled electronic device that is caused by leakage of a conductive operating medium such as water is avoided.

15 Claims, 8 Drawing Sheets

(56) References Cited

U.S. PATENT DOCUMENTS

2014/0190660 A1     7/2014   Harrington
2015/0136604 A1*   5/2015   Nielsen ................ B01F 33/452
                                                                      204/453
2015/0223367 A1     8/2015   Harrington

FOREIGN PATENT DOCUMENTS

| | | |
|---|---|---|
| CN | 103699195 A | 4/2014 |
| CN | 103813688 A | 5/2014 |
| CN | 104602487 A | 5/2015 |
| CN | 104822242 A | 8/2015 |
| CN | 105652989 A | 6/2016 |
| CN | 107608407 A | 1/2018 |
| DE | 102006033030 A1 | 1/2008 |
| EP | 2392202 B1 | 12/2014 |
| TW | M440424 U | 11/2012 |

* cited by examiner

NEGATIVE PRESSURE LIQUID COOLING SYSTEM AND CONTROL METHOD FOR CONTROLLING NEGATIVE PRESSURE LIQUID COOLING SYSTEM

CROSS-REFERENCE TO RELATED APPLICATIONS

This application is a continuation of International Application No. PCT/CN2018/104063, filed on Sep. 5, 2018, which claims priority to Chinese Patent Application No. 201710796380.8, filed on Sep. 6, 2017, the disclosures of which are incorporated herein by reference in their entireties.

TECHNICAL FIELD

The present disclosure relates to the field of board cooling technologies, and in particular, relates to a negative pressure liquid cooling system and a method for controlling a negative pressure liquid cooling system.

BACKGROUND

As integration of electronic parts and components increases, power consumption density of a chip also increases. The power consumption density is power consumption per unit area. A large power consumption density means that more heat is accumulated in a same area, and heat dissipation pressure is increased. A conventional air-cooled heat dissipation manner cannot meet an increasing heat dissipation requirement of the chip. Liquid cooling technologies with high heat dissipation efficiency are widely used in, for example, a plurality of fields such as a data center, a server, and a personal computer (PC).

A liquid cooling system usually includes a cold plate, a heat exchanger, a pipeline, a liquid pump, and various sensors. The cold plate is laminated to a to-be-cooled board, and a fluid channel is disposed inside the cold plate, so that heat of the board can be transferred to a fluid. The fluid in the cold plate is flowed to the heat exchanger through the pipeline and the liquid pump, and the heat exchanger may transfer heat of a thermal fluid to a cold fluid, thereby implementing heat dissipation of the board. The liquid pump is configured to regulate a flowing speed of a coolant in the pipeline, to regulate a heat exchange speed of the coolant. The sensor is configured to detect a pressure, a temperature, and the like in the liquid cooling system.

A conventional liquid cooling system is usually a positive pressure system, to be specific, a liquid pressure in a pipeline is greater than an ambient pressure outside the pipeline. When the pipeline is perforated due to corrosion or another reason, liquid in the pipeline leaks from the perforation to a board, to cause damage to the board. For example, when the coolant is water, if water in the pipeline leaks into the board, an incident such as a short circuit or a burnout of the board may be caused.

SUMMARY

In view of the above, the present disclosure provides a negative pressure liquid cooling system and a method for controlling a negative pressure liquid cooling system, to resolve a technical problem of coolant leakage in a conventional liquid cooling system. The technical solutions are as follows:

According to a first aspect, this application provides a method for controlling a negative pressure liquid cooling system, where the method is applied to a negative pressure liquid cooling system, and the negative pressure liquid cooling system includes a cold plate, a coolant storage tank, a vacuum pump, a solenoid valve, a liquid pump, and a heat exchanger, where the cold plate is configured to cool a to-be-cooled device, the coolant storage tank is connected to an outlet of the cold plate, the vacuum pump is connected to the coolant storage tank through the solenoid valve, an inlet of the liquid pump is connected to the coolant storage tank, the heat exchanger includes a first loop and a second loop that are mutually isolated, a fluid in the first loop is used to cool a fluid in the second loop, an inlet of the second loop is connected to an outlet of the liquid pump, and an outlet of the second loop is connected to an inlet of the cold plate; and the method includes:

detecting a first pressure value in the coolant storage tank; and enabling the vacuum pump and the solenoid valve when the first pressure value is greater than a second preset pressure value until the first pressure value is decreased to a first preset pressure range, where the second preset pressure value is a maximum value of the first preset pressure range, a minimum value of the first preset pressure range is a first preset pressure value, and both the first preset pressure value and the second preset pressure value are less than one standard atmosphere; disabling the vacuum pump and enabling the solenoid valve when the first pressure value is less than the first preset pressure value until the first pressure value is increased to the first preset pressure range; or regulating a rotational speed of the liquid pump when the first pressure value is within the first preset pressure range and a second pressure value at the inlet of the cold plate is not within a second preset pressure range, so that the second pressure value remains within the second preset pressure range, where a minimum value of the second preset pressure range is a third preset pressure value, a maximum value of the second preset pressure range is a fourth preset pressure range, both the third preset pressure value and the fourth preset pressure value are less than one standard atmosphere, and the third preset pressure value is greater than the second preset pressure value.

In one embodiment, pressures at the inlet and the outlet of the cold plate are separately controlled, so that the pressures at the inlet and the outlet of the cold plate remain negative. In this way, when a pipeline between the inlet and the outlet of the cold plate is perforated, a pressure at the outlet of the cold plate can be separately controlled to remain negative, so that a coolant is suppressed in the pipeline, and a coolant leakage phenomenon is avoided. Therefore, damage or a security threat to a to-be-cooled electronic device that is caused by leakage of a conductive operating medium such as water is avoided.

In one embodiment, the method further includes: collecting statistics on a working time ratio of the vacuum pump when the second pressure value is within the second preset pressure range, where the working time ratio is a ratio of an enabling time to a disabling time of the vacuum pump; and disabling the liquid pump and outputting a leakage alarm signal when the working time ratio of the vacuum pump is greater than a first specified value for a preset quantity of consecutive times.

In one embodiment, after the vacuum pump is enabled, the statistics on the working time ratio of the vacuum pump is collected. When leakage occurs in the system, a pressure in a water tank may increase, which may cause frequent enabling and disabling of the vacuum pump in a short time. Therefore, a system leakage incident can be predicted based on the working time ratio.

In another embodiment, after the enabling the vacuum pump and the solenoid valve when the first pressure value is greater than a second preset pressure value, the method further includes: after the vacuum pump is enabled for first preset duration, if it is detected that the first pressure value in the coolant storage tank is greater than the second preset pressure value, detecting whether the vacuum pump is faulty; and regulating the rotational speed of the liquid pump if it is detected that the vacuum pump is faulty, so that a difference between the second pressure value and the first pressure value is equal to a fifth preset pressure value, where the fifth preset pressure value is greater than 0.

In one embodiment, after the vacuum pump is enabled for the first preset duration, if the pressure in the coolant storage tank still does not reach the first preset pressure range, it is detected whether the vacuum pump is faulty. If the vacuum pump is faulty, the liquid pump is switched to a pressure difference mode, that is, the rotational speed of the liquid pump is regulated, so that a pressure difference between the inlet and the outlet of the cold plate remains a specified value. In addition, a leakage risk is prompted. In the control method, the leakage risk likely caused by the fault of the vacuum pump can be automatically detected, thereby further reducing a leakage risk of the system.

In another embodiment, the negative pressure liquid cooling system further includes a standby vacuum pump connected to the solenoid valve, and after the enabling the vacuum pump and the solenoid valve when the first pressure value is greater than a second preset pressure value, the method further includes: after the vacuum pump is enabled for first preset duration, if it is detected that the first pressure value in the coolant storage tank is greater than the second preset pressure value, detecting whether the vacuum pump is faulty; and enabling the standby vacuum pump if it is detected that the vacuum pump is faulty.

In one embodiment, the standby vacuum pump is disposed in the negative pressure liquid cooling system. After it is detected that the currently-run vacuum pump is faulty, the standby vacuum pump is enabled, so that the negative pressure liquid cooling system remains in a negative pressure state, and a leakage risk of the system is reduced.

In another embodiment, the regulating a rotational speed of the liquid pump, so that the second pressure value is within the second preset pressure range includes: when the second pressure value is greater than the fourth preset pressure value, decreasing the rotational speed of the liquid pump to decrease the second pressure value; or when the second pressure value is less than the third preset pressure value, increasing the rotational speed of the liquid pump to increase the second pressure value.

In one embodiment, a pressure at the inlet of the cold plate is regulated by regulating the rotational speed of the liquid pump, so that the pressure at the inlet of the cold plate is regulated separately to enable the pressure at the inlet of the cold plate to remain negative, a coolant is suppressed in the pipeline, and a coolant leakage risk is reduced.

According to a second aspect, this application provides a negative pressure liquid cooling system, including a cold plate, a coolant storage tank, a vacuum pump, a solenoid valve, a liquid pump, a heat exchanger, and a controller, where the cold plate is laminated to a to-be-cooled electronic device, and is configured to cool the to-be-cooled electronic device; an inlet of the coolant storage tank is connected to an outlet of the cold plate, and an outlet of the coolant storage tank is connected to an inlet of the liquid pump; the heat exchanger includes a first loop and a second loop that are mutually isolated, a fluid in the first loop is used to cool a fluid in the second loop, an inlet of the second loop is connected to an outlet of the liquid pump, and an outlet of the second loop is connected to an inlet of the cold plate; and the controller is configured to: control, by controlling working statuses of the vacuum pump and the solenoid valve, a first pressure value in the coolant storage tank to remain within a first preset pressure range; and control, by controlling a rotational speed of the liquid pump, a second pressure value at the inlet of the cold plate to remain within a second preset pressure range, where all pressures in the first preset pressure range and the second preset pressure range are less than one standard atmosphere, and a minimum value of the second preset pressure range is greater than a maximum value of the first preset pressure range.

In one embodiment, pressures at the inlet and the outlet of the cold plate are separately controlled to remain negative. When a pipeline between the inlet and the outlet of the cold plate is perforated, a pressure at the outlet of the cold plate can be separately controlled to remain negative, so that a coolant is suppressed in the pipeline, and a coolant leakage phenomenon is avoided. Therefore, damage or a security threat to a to-be-cooled electronic device that is caused by leakage of a conductive operating medium such as water is avoided.

In one embodiment, the system further includes a one-way valve. An inlet of the one-way valve is connected to the outlet of the second loop, and an outlet of the one-way valve is connected to the inlet of the cold plate.

In one embodiment, the one-way valve is a passive control component of the negative pressure liquid cooling system. When a perforation at the inlet of the cold plate is relatively large, a pressure at the perforation increases, and a pressure at the outlet of the one-way valve is greater than a pressure at the inlet of the one-way valve. In this case, the one-way valve is disabled, and a water flow is rapidly blocked. Therefore, it is ensured that the liquid pump has enough time to regulate a speed, so that the inlet of the cold plate is in a negative pressure state in real time, thereby avoiding a water leakage phenomenon that is caused by a slow response for speed regulation of the liquid pump.

In another embodiment, the system further includes a gas-liquid filter. An inlet of the gas-liquid filter is connected to the solenoid valve, an outlet of the gas-liquid filter is connected to the vacuum pump, and the gas-liquid filter is configured to filter water vapor included in gas that is pumped out of the coolant storage tank. Therefore, damage of the water vapor to the vacuum pump is effectively prevented.

In still another embodiment, when controlling, by controlling the working statuses of the vacuum pump and the solenoid valve, the first pressure value in the coolant storage tank to remain within the first preset pressure range, the controller is specifically configured to: detect the first pressure value; enable the vacuum pump and the solenoid valve when the first pressure value is greater than a second preset pressure value until the first pressure value is decreased to the first preset pressure range, where a minimum value of the first preset pressure range is a first preset pressure value, the maximum value of the first preset pressure range is the second preset pressure value, and both the first preset pressure value and the second preset pressure value are less than one standard atmosphere; disable the vacuum pump and enable the solenoid valve when the first pressure value is less than the first preset pressure value until the first pressure value is within the first preset pressure range; or when the first pressure value is within the first preset pressure range and the second pressure value is not within the second preset pressure range, control, by controlling the rotational speed of the liquid pump, the second pressure value to remain within the second preset pressure range.

In one embodiment, a pressure in the coolant storage tank, that is, a pressure at the outlet of the cold plate is detected. When the pressure in the coolant storage tank is greater than the maximum value of the first preset pressure range, the vacuum pump and the solenoid valve are enabled, and air is pumped out of the coolant storage tank, so that the pressure in the coolant storage tank is decreased. When the pressure in the coolant storage tank is less than the minimum value of the first preset pressure range, the vacuum pump is disabled and the solenoid valve is enabled, so that air enters the coolant storage tank through the solenoid valve, thereby increasing the pressure in the coolant storage tank. Finally, the pressure at the outlet of the cold plate remains within a negative pressure range, so that a coolant is suppressed in the pipeline, and a coolant leakage risk is reduced.

In another embodiment, when controlling, by controlling the working statuses of the vacuum pump and the solenoid valve, the pressure in the coolant storage tank to remain within the first preset pressure range, the controller is further configured to: collect statistics on a working time ratio of the vacuum pump when the second pressure value is within the second preset pressure range, where the working time ratio is a ratio of an enabling time to a disabling time of the vacuum pump; and disable the liquid pump when the working time ratio of the vacuum pump is greater than a first specified value for a preset quantity of consecutive times.

In one embodiment, after the vacuum pump is enabled, the statistics on the working time ratio of the vacuum pump is collected. When leakage occurs in the system, a pressure in a water tank may increase, which may cause frequent enabling and disabling of the vacuum pump in a short time. Therefore, a system leakage incident can be predicted based on the working time ratio.

In another embodiment, when controlling, by controlling the working statuses of the vacuum pump and the solenoid valve, the pressure in the coolant storage tank to remain within the first preset pressure range, the controller is further configured to: after the vacuum pump is enabled for first preset duration, if it is detected that the first pressure value in the coolant storage tank is greater than the second preset pressure value, detect whether the vacuum pump is faulty; and regulate the rotational speed of the liquid pump if it is detected that the vacuum pump is faulty, so that a difference between the second pressure value and the first pressure value is equal to a fifth preset pressure value, where the fifth preset pressure value is greater than 0.

In one embodiment, after the vacuum pump is enabled for the first preset duration, if a pressure in the coolant storage tank still does not reach the first preset pressure range, it is detected whether the vacuum pump is faulty. If the vacuum pump is faulty, the liquid pump is switched to a pressure difference mode, that is, the rotational speed of the liquid pump is regulated, so that a pressure difference between the inlet and the outlet of the cold plate remains a specified value. In addition, a leakage risk is prompted. In the control method, the leakage risk likely caused by the fault of the vacuum pump can be automatically detected, thereby further reducing a leakage risk of the system.

In another embodiment, the system further includes a standby vacuum pump connected to the solenoid valve, and when controlling, by controlling the working statuses of the vacuum pump and the solenoid valve, the pressure in the coolant storage tank to remain within the first preset pressure range, the controller is further configured to: after the vacuum pump is enabled for first preset duration, if it is detected that the first pressure value in the coolant storage tank is greater than the second preset pressure value, detect whether the vacuum pump is faulty; and enable the standby vacuum pump if it is detected that the vacuum pump is faulty.

In one embodiment, the standby vacuum pump is added. After it is detected that the currently-run vacuum pump is faulty, the standby vacuum pump is enabled, so that the negative pressure liquid cooling system remains in a negative pressure state, and a leakage risk of the system is reduced.

In another embodiment, the minimum value of the second preset pressure range is a third preset pressure value, a maximum value of the second preset pressure range is a fourth preset pressure value, and both the third preset pressure value and the fourth preset pressure value are less than one standard atmosphere; and when controlling, by controlling the rotational speed of the liquid pump, the second pressure value to remain within the second preset pressure range, the controller is specifically configured to: decrease the rotational speed of the liquid pump when the second pressure value is greater than the fourth preset pressure value, so that the second pressure value is less than the fourth preset pressure value; or increase the rotational speed of the liquid pump when the second pressure value is less than the third preset pressure value, so that the second pressure value is greater than the third preset pressure value.

In one embodiment, a pressure at the inlet of the cold plate is regulated by regulating the rotational speed of the liquid pump, so that the pressure at the inlet of the cold plate is regulated separately to enable the pressure at the inlet of the cold plate to remain negative, a coolant is suppressed in the pipeline, and a coolant leakage risk is reduced.

According to a third aspect, this application further provides a processor, configured to run a program, where when the program runs, the processor performs the method for controlling a negative pressure liquid cooling system in the first aspect.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show some embodiments of the present disclosure, and a person of ordinary skill in the art may still derive other drawings from these accompanying drawings without creative efforts.

DESCRIPTION OF EMBODIMENTS

A conventional liquid cooling system is usually a positive pressure system, to be specific, a liquid pressure in a pipeline is greater than an ambient pressure outside the pipeline in the system. In this case, when a pipeline between an inlet and an outlet of a cold plate is perforated, liquid in the pipeline leaks from the perforation to a to-be-cooled electronic device, causing damage or a security threat to the to-be-cooled electronic device. Some conventional liquid cooling systems are negative pressure systems. However, the conventional negative pressure system uses a constant pressure difference between an inlet and an outlet of a cold plate to control a liquid volume in the system. When the system normally works, a pressure in the system can remain negative. However, when a pipeline between the inlet and the outlet of the cold plate is perforated, a pressure at the outlet of the cold plate increases. If the liquid volume is still controlled based on the constant pressure difference between the inlet and the outlet of the cold plate, a pressure at the inlet of the cold plate synchronously increases, and consequently the pressure at the inlet of the cold plate is greater than a pressure outside the pipeline, in other words, the system is evolved into a positive pressure system, and finally a coolant leaks from the perforation of the pipeline. According to a method for controlling a negative pressure liquid cooling system provided in this application, pressure values at the inlet and the outlet of the cold plate are separately controlled, and the pressure values each remain negative. In this way, when the pipeline between the inlet and the outlet of the cold plate is perforated, a quick response is performed to enable the pressure at the outlet of the cold plate to remain negative, so that the coolant is suppressed in the pipeline, and the coolant is prevented from leaking into the to-be-cooled electronic device. Therefore, damage or a security threat to the to-be-cooled electronic device that is caused by leakage of a conductive operating medium such as water is avoided.

Figure 1:
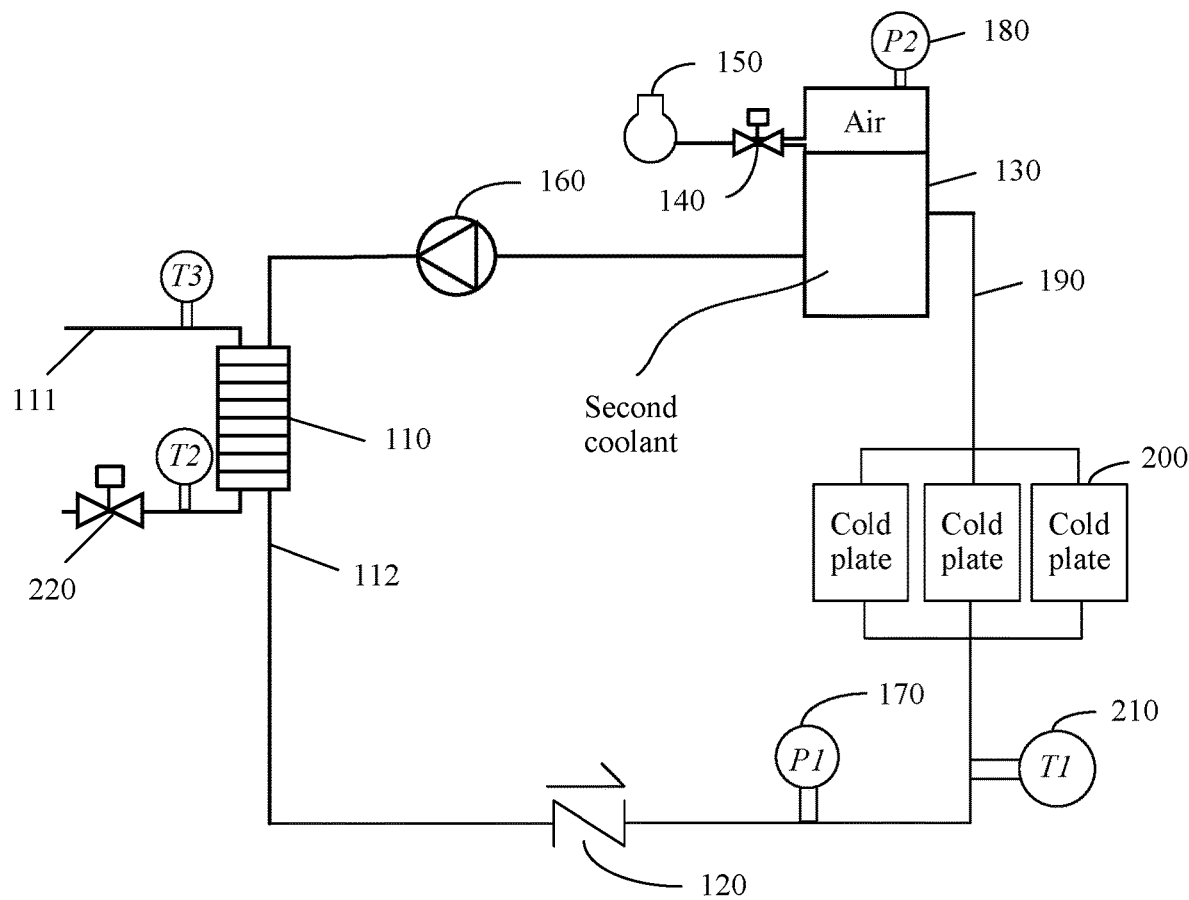
FIG. 1 is a schematic diagram of a principle of a negative pressure liquid cooling system according to an embodiment.

FIG. 1 is a schematic diagram of a principle of a negative pressure liquid cooling system according to an embodiment. In one embodiment, an example in which a coolant is water is used for description. Certainly, in another embodiment, the coolant may be another type of liquid.

As shown in FIG. 1, the system may include a heat exchanger 110, a one-way valve 120, a water tank 130 (namely, a coolant storage tank), a solenoid valve 140, a vacuum pump 150, a liquid pump 160, a first pressure sensor 170, a second pressure sensor 180, a pipeline 190, a cold plate 200, and a controller (not shown in FIG. 1).

The heat exchanger 110 includes a first loop 111 and a second loop 112 that are mutually isolated, where a second coolant in the second loop is used to cool a to-be-cooled electronic device, and a first coolant in the first loop is used to cool the second coolant in the second loop.

An outlet of the second loop of the heat exchanger 110 is connected to an inlet of the one-way valve 120, an outlet of the one-way valve 120 is connected to an inlet of the cold plate, and an outlet of the cold plate is connected to an inlet of the water tank 130.

The cold plate 200 is laminated to a board (namely, the to-be-cooled electronic device), and a coolant in the cold plate 200 performs heat exchange with heat emitted by the board, to implement heat dissipation of the board.

An outlet of the water tank 130 is connected to an inlet of the liquid pump 160, and an outlet of the liquid pump 160 is connected to an inlet of the second loop of the heat exchanger 110.

The first pressure sensor 170 is disposed at the inlet of the cold plate, and is configured to detect a pressure at the inlet of the cold plate.

The second pressure sensor 180 is disposed above liquid in the coolant storage tank, and is configured to detect a pressure in the coolant storage tank.

An overall working process of the negative pressure liquid cooling system is as follows: Heat generated by the board is transferred to a second coolant in the cold plate by using the cold plate 200. After entering the water tank 130 through the pipeline 190, the second coolant is pumped by the liquid pump 160 to the heat exchanger 110. The first coolant in the first loop 111 in the heat exchanger 110 performs heat exchange with the second coolant to cool the second coolant. Then, the second coolant is returned to the cold plate 200 through the one-way valve 120. This process is repeated, and the board is cooled.

The water tank 130 is filled with a specific quantity of second coolants and a specific amount of air, and the second pressure sensor 180 is disposed above a liquid level of the second coolant, and is configured to detect a pressure in the water tank 130 (namely, a pressure at the outlet of the cold plate), and provide the detected pressure value for the controller.

When the pressure in the water tank 130 exceeds a first preset pressure range (the first preset pressure range is within a negative pressure range) due to air infiltration, the controller controls enabling of the vacuum pump 150 and the solenoid valve 140, the vacuum pump 150 pumps redundant air out of the water tank 130, and when the pressure in the water tank is returned to the first preset pressure range, the controller controls disabling of the vacuum pump 150 and the solenoid valve 140, so that the outlet of the cold plate remains in a negative pressure state.

The first pressure sensor 170 is disposed at the inlet of the cold plate 200, and is configured to detect the pressure value at the inlet of the cold plate 200 and provide the pressure value for the controller.

When the pressure at the inlet of the cold plate is a positive pressure or exceeds a second preset pressure range (the second preset pressure range is within a negative pressure range), the controller lowers a rotational speed of the liquid pump 160, so that the pressure at the inlet of the cold plate is returned to the second preset pressure range, and after the pressure at the inlet of the cold plate is returned to the second preset pressure range, the rotational speed of the liquid pump 160 is controlled to be stabilized at a current rotational speed. In addition, values of the second preset pressure range and the first preset pressure range can ensure that a specific positive pressure difference is always remained between the pressure at the inlet of the cold plate and the pressure at the outlet of the cold plate, in other words, the pressure at the inlet of the cold plate is always greater than the pressure at the outlet of the cold plate.

In the foregoing control process, the pressure at the inlet of the cold plate and the pressure at the outlet of cold plate can be separately controlled to be within a specified negative pressure range, and a pressure difference between the inlet of the cold plate and the outlet of the cold plate remains a specific positive pressure difference.

The one-way valve 120 is disposed between the outlet of the second loop of the heat exchanger 110 and the inlet of the cold plate. The one-way valve 120 is a passive control component of the negative pressure liquid cooling system, and is combined with an active control component of the controller to ensure that the second coolant in the negative pressure liquid cooling system does not leak. When a perforation at the inlet of the cold plate is relatively large, a pressure at the perforation increases, and a pressure at the outlet of the one-way valve 120 is greater than a pressure at the inlet of the one-way valve 120. In this case, the one-way valve 120 is disabled, and a water flow is rapidly blocked. Therefore, it is ensured that the liquid pump 160 has enough time to regulate a speed, so that the inlet of the cold plate is in a negative pressure state in real time, thereby avoiding a water leakage phenomenon that is caused by a slow response for speed regulation of the liquid pump 160.

In addition, a temperature sensor 210 is disposed at the inlet of the cold plate 200. The temperature sensor 210 is configured to detect a temperature of the second coolant at the inlet of the cold plate. When the temperature of the second coolant is not within a preset range, the controller regulates a liquid volume of the first coolant in the first loop 111 by regulating a regulation valve 220 in the first loop 111, to control a heat exchange capability of the heat exchanger 110, so that the temperature of the second coolant at the inlet of the cold plate reaches the preset range.

According to the negative pressure liquid cooling system provided in this embodiment, the controller separately controls the inlet and the outlet of the cold plate to ensure that both the inlet and the outlet of the cold plate are in a negative pressure. In this way, when a pipeline between the inlet and the outlet of the cold plate in the negative pressure liquid cooling system is perforated, the controller can separately control the rotational speed of the liquid pump and the vacuum pump, to return the inlet and the outlet of the cold plate to a negative pressure, so that the coolant is suppressed in the pipeline, and a coolant leakage phenomenon is avoided. In addition, the one-way valve is disposed between the outlet of the second loop of the heat exchanger and the inlet of the cold plate, the inlet of the one-way valve is connected to the heat exchanger, and the outlet of the one-way valve is connected to the cold plate. When a pipeline connected to the inlet of the cold plate is perforated, a pressure at the perforation increases, a pressure at the outlet of the one-way valve is greater than a pressure at the inlet of the one-way valve, the one-way valve is disabled, and a water flow is rapidly blocked, to save time for the controller to control the liquid pump to regulate a speed, thereby ensuring that the pressure at the inlet of the cold plate is returned to the second preset pressure range.

Figure 2:
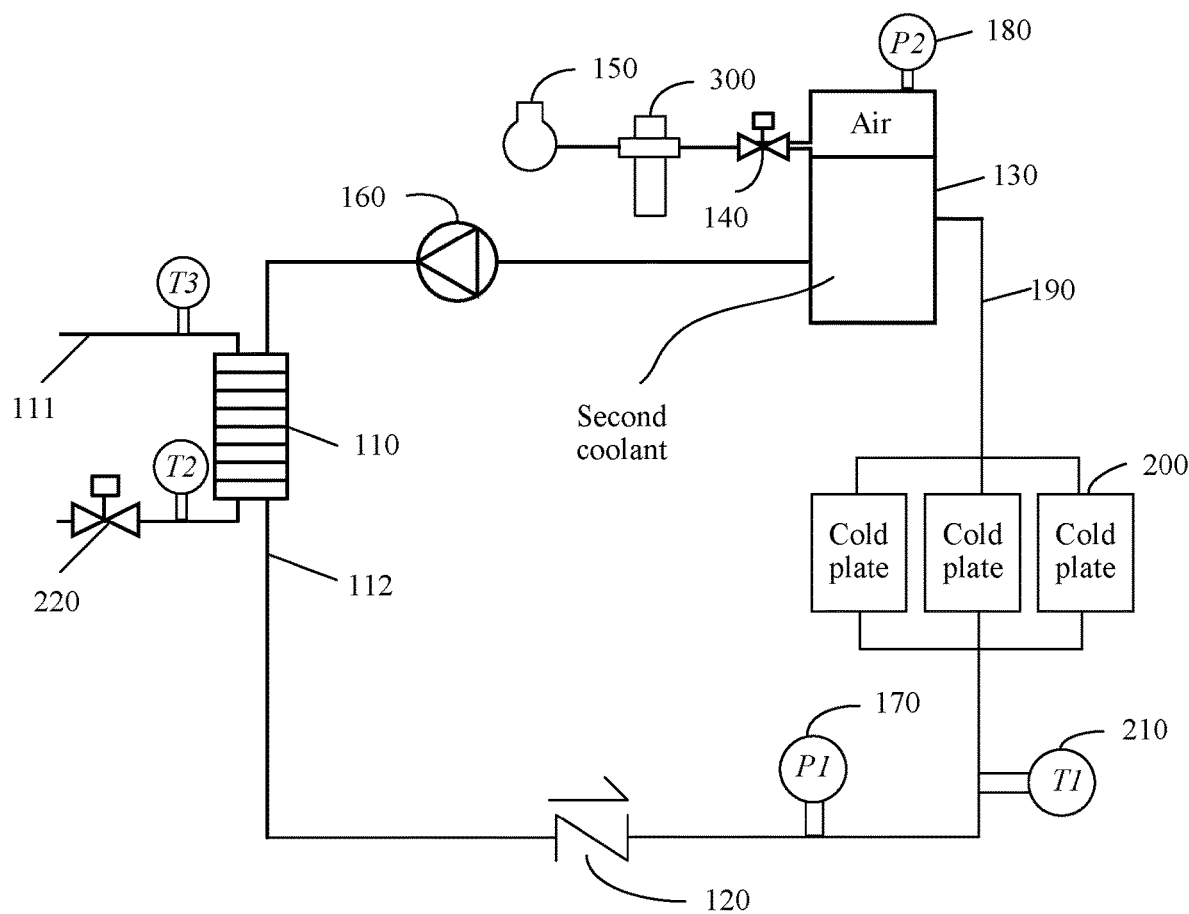
FIG. 2 is a schematic diagram of a principle of another negative pressure liquid cooling system according to an embodiment.

FIG. 2 is a schematic diagram of a principle of another negative pressure liquid cooling system according to an embodiment. A gas-liquid filter 300 is added to the negative pressure liquid cooling system provided herein. The gas-liquid filter 300 is disposed between a vacuum pump 150 and a solenoid valve 140, and is configured to filter water vapor in gas that is pumped out of a coolant storage tank 130, thereby effectively preventing damage of the water vapor to the vacuum pump 150. A connection manner of another component is the same as that in the negative pressure liquid cooling system shown in FIG. 1, and details are not described herein again.

Figure 3:
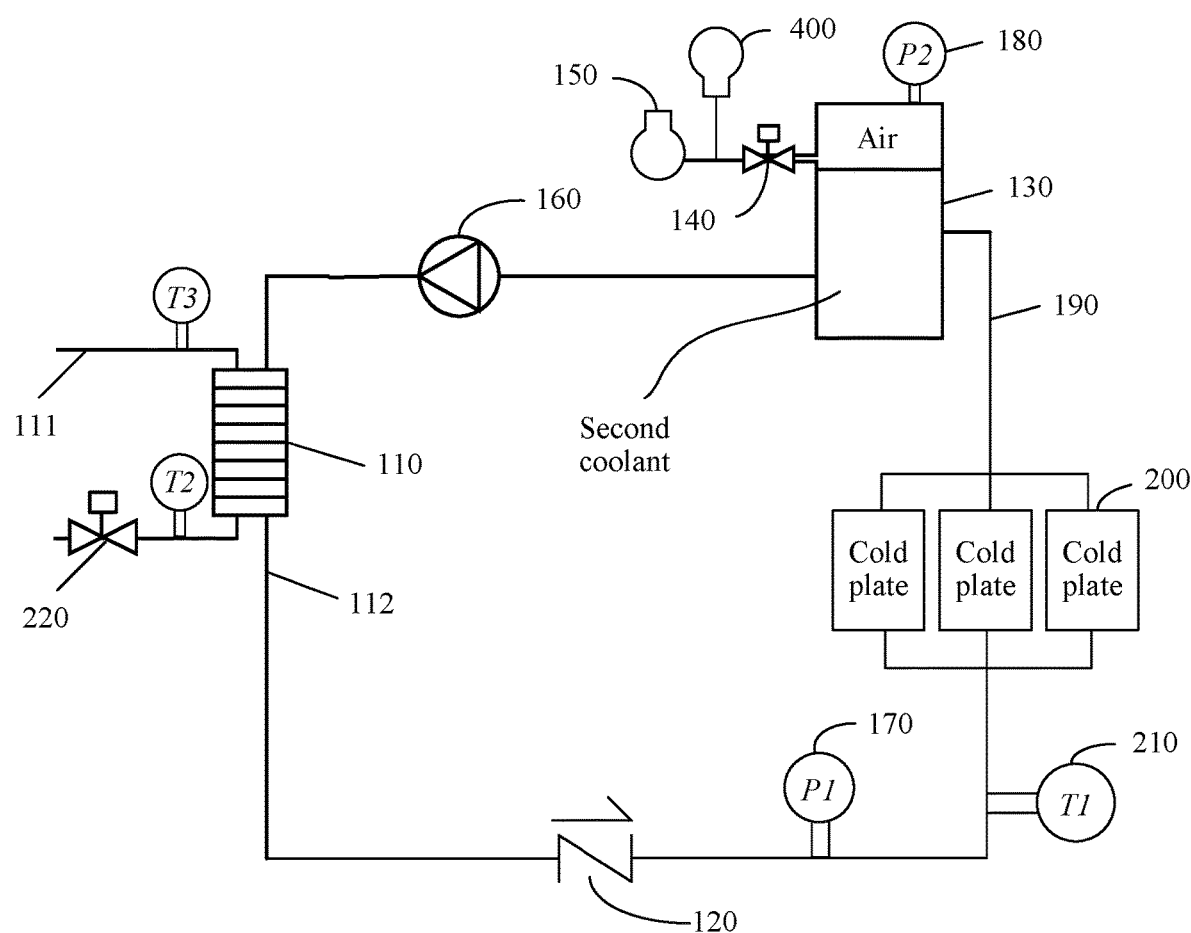
FIG. 3 is a schematic diagram of a principle of still another negative pressure liquid cooling system according to an embodiment.

FIG. 3 is a schematic diagram of a principle of still another negative pressure liquid cooling system according to an embodiment. In one embodiment, a standby vacuum pump 400 is added in this embodiment based on the embodiment shown in FIG. 1. When one vacuum pump is faulty, another vacuum pump may be enabled to ensure that a pressure in the system remains negative. A connection manner of another component is the same as that in the negative pressure liquid cooling system shown in FIG. 1, and details are not described herein again.

Figure 4:
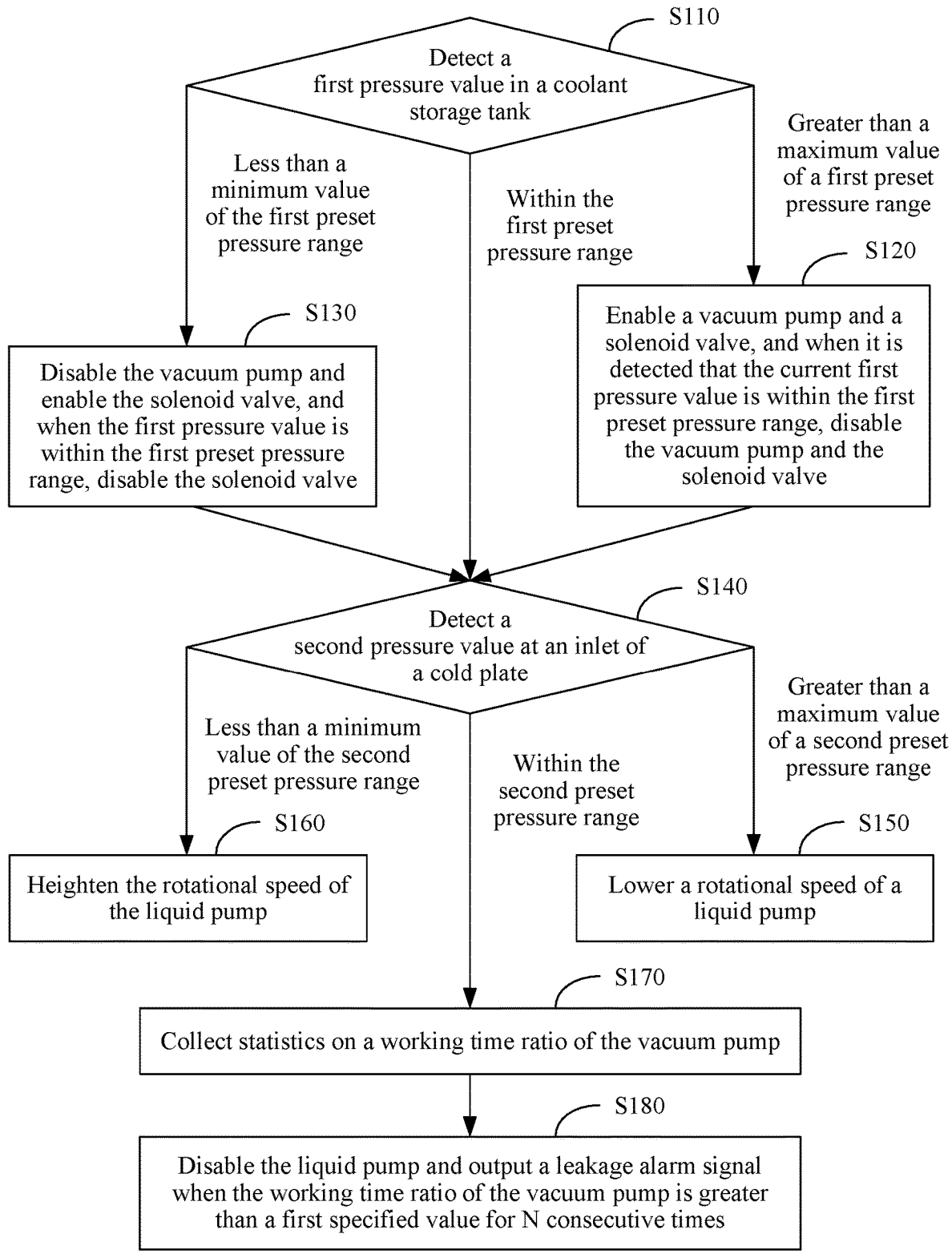
FIG. 4 is a flowchart of a method for controlling a negative pressure liquid cooling system according to an embodiment.

FIG. 4 is a flowchart of a method for controlling a negative pressure liquid cooling system according to an embodiment. The method is applied to the controllers in the negative pressure liquid cooling systems shown in FIG. 1 and FIG. 2. As shown in FIG. 4, the method may include the following steps.

S110. Detect a pressure (namely, a first pressure value) in a coolant storage tank.

If the first pressure value is within a first preset pressure range, S140 is performed. If the first pressure value is greater than a maximum value of the first preset pressure range (namely, a second preset pressure value), S120 is performed. If the first pressure value is less than a minimum value of the first preset pressure range (namely, a first preset pressure value), S130 is performed.

The pressure in the coolant storage tank is a pressure at an outlet of a cold plate. The first pressure value is obtained by a first pressure sensor through collection, and is provided for the controller.

The minimum value of the first preset pressure range is the first preset pressure value, and the maximum value of the first preset pressure range is the second preset pressure value. The first preset pressure value and the second preset pressure value may be set based on an actual system situation. For example, if the pressure in the coolant storage tank is set to 40 kPa, and an allowable error range is ±1 kPa, the first preset pressure range is [39 kPa, 41 kPa], to be specific, the first preset pressure value is 39 kPa, and the second preset pressure value is 41 kPa.

S120. Enable a vacuum pump and a solenoid valve, and when it is detected that the current first pressure value is within the first preset pressure range, disable the vacuum pump and the solenoid valve.

For example, if the pressure in the coolant storage tank is greater than 41 kPa, the vacuum pump and the solenoid valve are enabled.

S130. Disable the vacuum pump and enable the solenoid valve, and when the current first pressure value is within the first preset pressure range, disable the solenoid valve.

S140. Detect a pressure (namely, a second pressure value) at an inlet of the cold plate.

If the second pressure value is within a second preset pressure range, S170 is performed. If the second pressure value is greater than a fourth preset pressure value, S150 is performed. If the second pressure value is less than a third preset pressure value, S160 is performed.

After the pressure in the coolant storage tank is regulated to the first preset pressure range, the pressure at the inlet of the cold plate is regulated, in other words, S140 is performed after S120 or S130.

A minimum value of the second preset pressure range is the third preset pressure value, and a maximum value of the second preset pressure range is the fourth preset pressure value. The second preset pressure range is determined based on an actual system situation. A positive pressure difference between the second preset pressure range and the first preset pressure range is remained, to be specific, the minimum pressure value of the second preset pressure range is greater than the maximum pressure value of the first preset pressure range, in other words, the pressure at the inlet of the cold plate is always greater than the pressure at the outlet of the cold plate.

For example, if the pressure at the inlet of the cold plate is set to 90 kPa, and an allowable error is ±1 kPa, the second preset pressure range is [89 kPa, 91 kPa], to be specific, the third preset pressure value is 89 kPa, and the fourth preset pressure value is 91 kPa.

S150. Lower a rotational speed of a liquid pump, so that the second pressure value is decreased to the second preset pressure range.

S160. Heighten the rotational speed of the liquid pump, so that the second pressure value is increased to the second preset pressure range.

In one embodiment, referring back to S110 after S150 or S160 to repeatedly monitor a running status of the negative pressure liquid cooling system.

In another embodiment, the following steps are performed after S150 or S160.

S170. Collect statistics on a working time ratio of the vacuum pump.

The working time ratio is a ratio of an enabling time to a disabling time of the vacuum pump. A proper working time ratio can avoid a case in which a long working time of the vacuum pump affects a service life of the vacuum pump. In addition, when leakage occurs in the system, a pressure in a water tank may increase, which may cause frequent enabling and disabling of the vacuum pump in a short time. Therefore, a system leakage incident can be predicted based on the working time ratio.

S180. Disable the liquid pump and output a leakage alarm signal when the working time ratio of the vacuum pump is greater than a first specified value for N consecutive times.

When a statistical time is less than the first specified value, go back to S110 to repeatedly monitor the running status of the liquid cooling system.

N may be set based on an actual requirement, for example, set to 3. The first specified value may be set based on performance of the vacuum pump, for example, set to 3:1.

When it is detected that the working time ratio of the vacuum pump is greater than the first specified value for N consecutive times, it indicates that a leakage phenomenon may exist in the negative pressure liquid cooling system, and the controller sends a control signal to control an alarm apparatus to perform alarming. In addition, the controller controls the liquid pump to stop running, and slows a leakage speed of a coolant.

The alarm apparatus may be an audible and visual alarm, or may send an instant messaging message to a worker, so that the worker quickly checks a leakage status of the system after receiving an alarm signal.

In one embodiment, pressures at the inlet of the cold plate and the outlet of the cold plate are separately detected and controlled. In this way, when a pipeline between the inlet and the outlet of the cold plate is perforated, the controller can separately control the rotational speed of the liquid pump and the vacuum pump, to return the inlet and the outlet of the cold plate to a negative pressure, so that the coolant is suppressed in the pipeline, and a coolant leakage phenomenon is avoided. Therefore, damage or a security threat to a to-be-cooled electronic device that is caused by leakage of a conductive operating medium such as water is avoided.

Figure 5A:
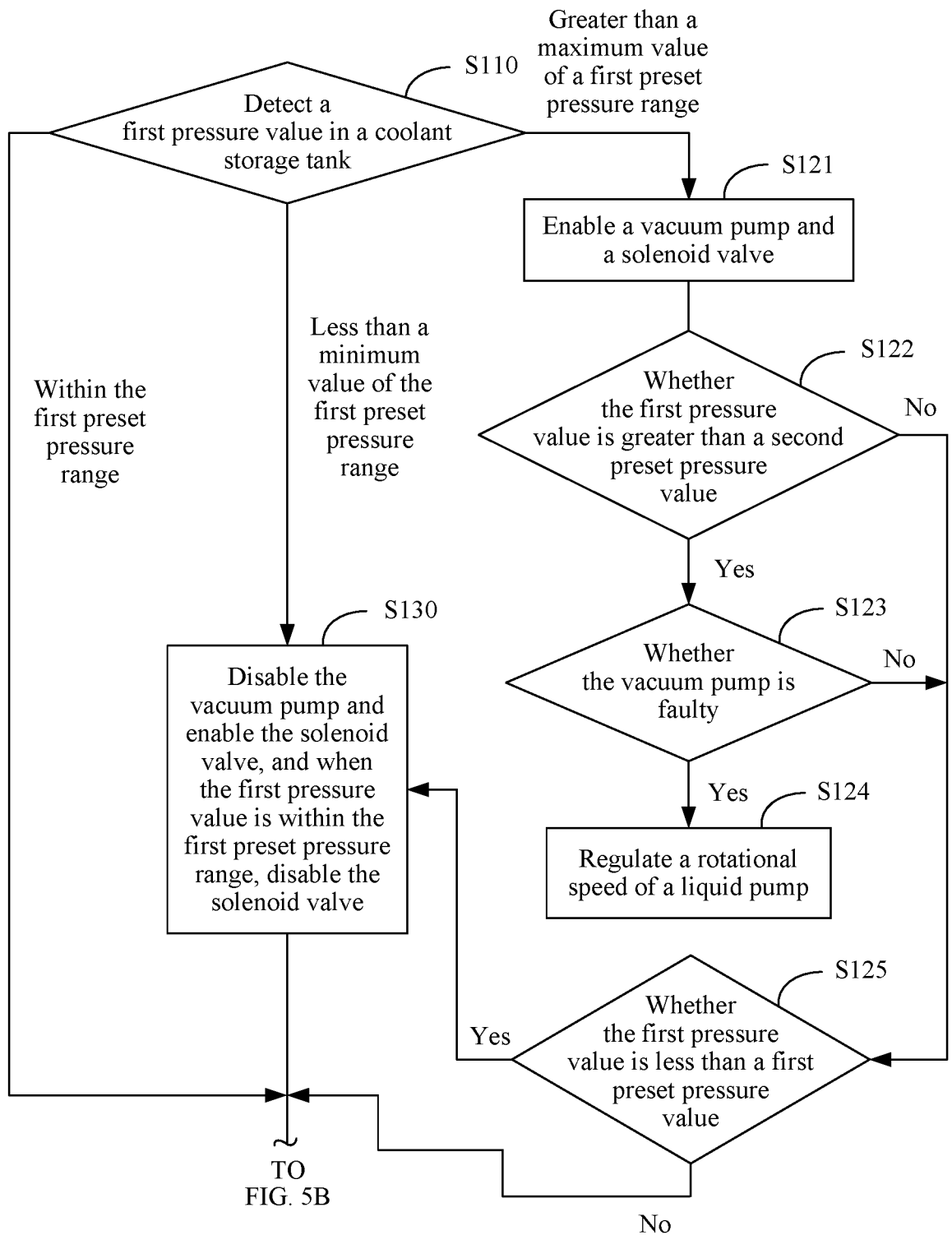
FIG. 5A and FIG. 5B are a flowchart of another method for controlling a negative pressure liquid cooling system according to an embodiment.
Figure 5B:
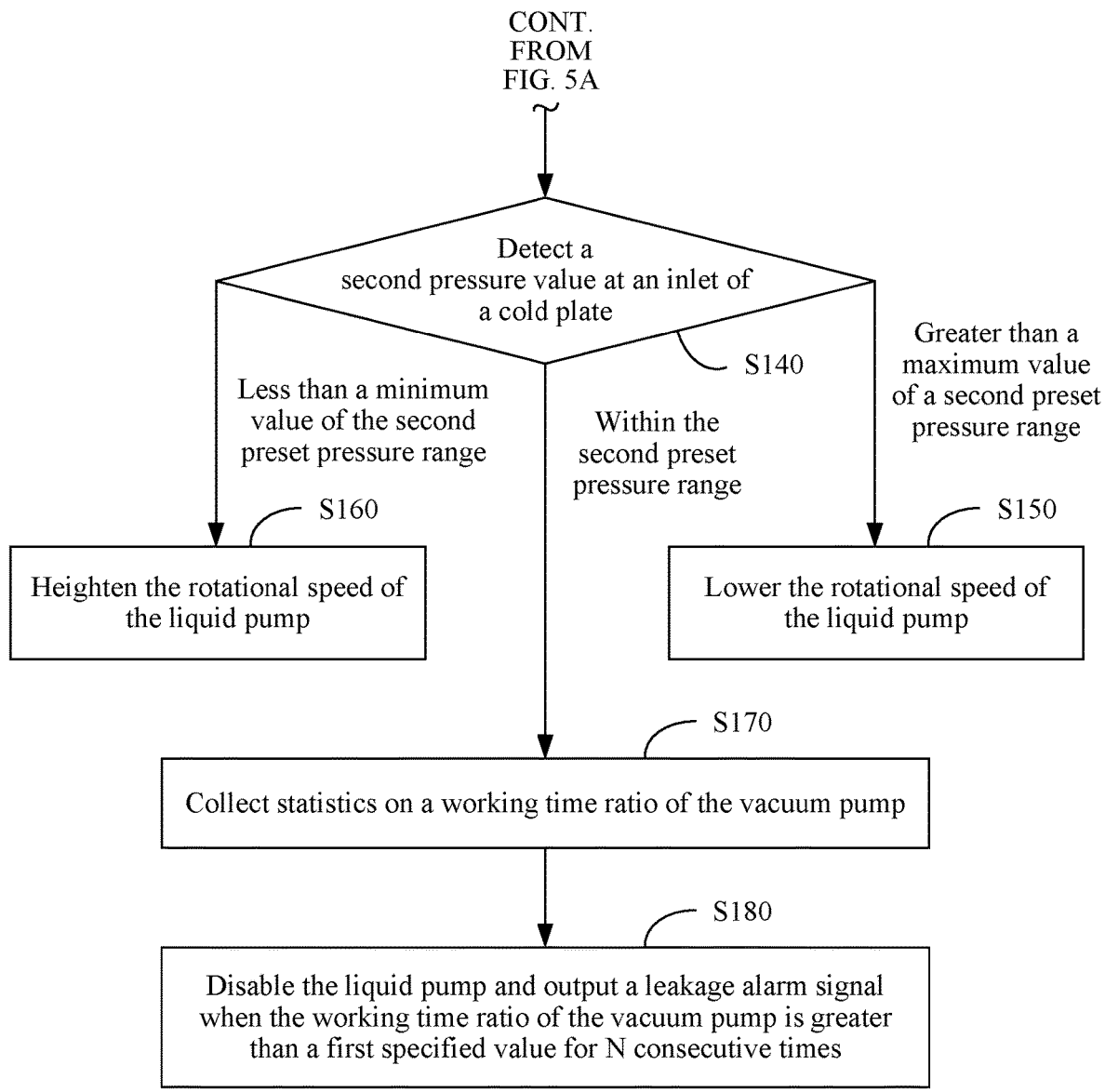

FIG. 5A and FIG. 5B are a flowchart of another method for controlling a negative pressure liquid cooling system according to an embodiment. In one embodiment, a procedure of detecting whether a vacuum pump is faulty is added, and S120 in FIG. 4 is replaced with the following steps.

S121. Enable a vacuum pump and a solenoid valve.

S122. After the vacuum pump is enabled for first preset duration, detected whether a current first pressure value in a coolant storage tank is greater than a second preset pressure value; and if yes, perform S123, or if no, perform S125.

The first preset duration needs to be determined based on working duration that is required to enable a first pressure in a water tank to reach a first preset pressure range when the vacuum pump normally works.

In an embodiment, the first preset duration is determined based on a volume of the water tank and an air pumping rate of the vacuum pump, or is obtained based on test data of the negative pressure liquid cooling system, for example, 60 s.

S123. Detect whether the vacuum pump is faulty; and if yes, perform S124, or if no, perform S125.

S124. Regulate a rotational speed of a liquid pump and output a leakage alarm signal, so that a difference between a second pressure value and the first pressure value is equal to a fifth preset pressure value.

If it is detected that the vacuum pump is faulty, the liquid pump is switched to a pressure difference mode, to ensure that a pressure difference between an inlet of a cold plate and an outlet of the cold plate is always the fifth preset pressure value, where the fifth preset pressure value is greater than 0, and the fifth preset pressure value may be equal to a difference between a third preset pressure value and the second preset pressure value, or another value.

A pressure at the inlet of the cold plate may be regulated by regulating the rotational speed of the liquid pump, to ensure that the pressure difference between the inlet and the outlet of the cold plate is a specified positive pressure value.

If the vacuum pump is faulty, the system may be evolved into a positive pressure system. When a pipeline between the inlet and the outlet of the cold plate is perforated, there is a leakage risk. Therefore, when the liquid pump is switched to the pressure difference mode, the leakage alarm signal is output to prompt that there may be a leakage risk.

S125. Detect whether the current first pressure value in the coolant storage tank is greater than a first preset pressure value; and if yes, perform S130, or if no, perform S140.

In one embodiment, after the vacuum pump is enabled for the first preset duration, if a pressure in the coolant storage tank still does not reach the first preset pressure range, it is detected whether the vacuum pump is faulty. If the vacuum pump is faulty, the liquid pump is switched to the pressure difference mode, that is, the rotational speed of the liquid pump is regulated, so that the pressure difference between the inlet and the outlet of the cold plate remains a specified value. In addition, a leakage risk is prompted. In the control method, the leakage risk likely caused by the fault of the vacuum pump can be automatically detected, thereby further reducing a leakage risk of the system.

Figure 6A:
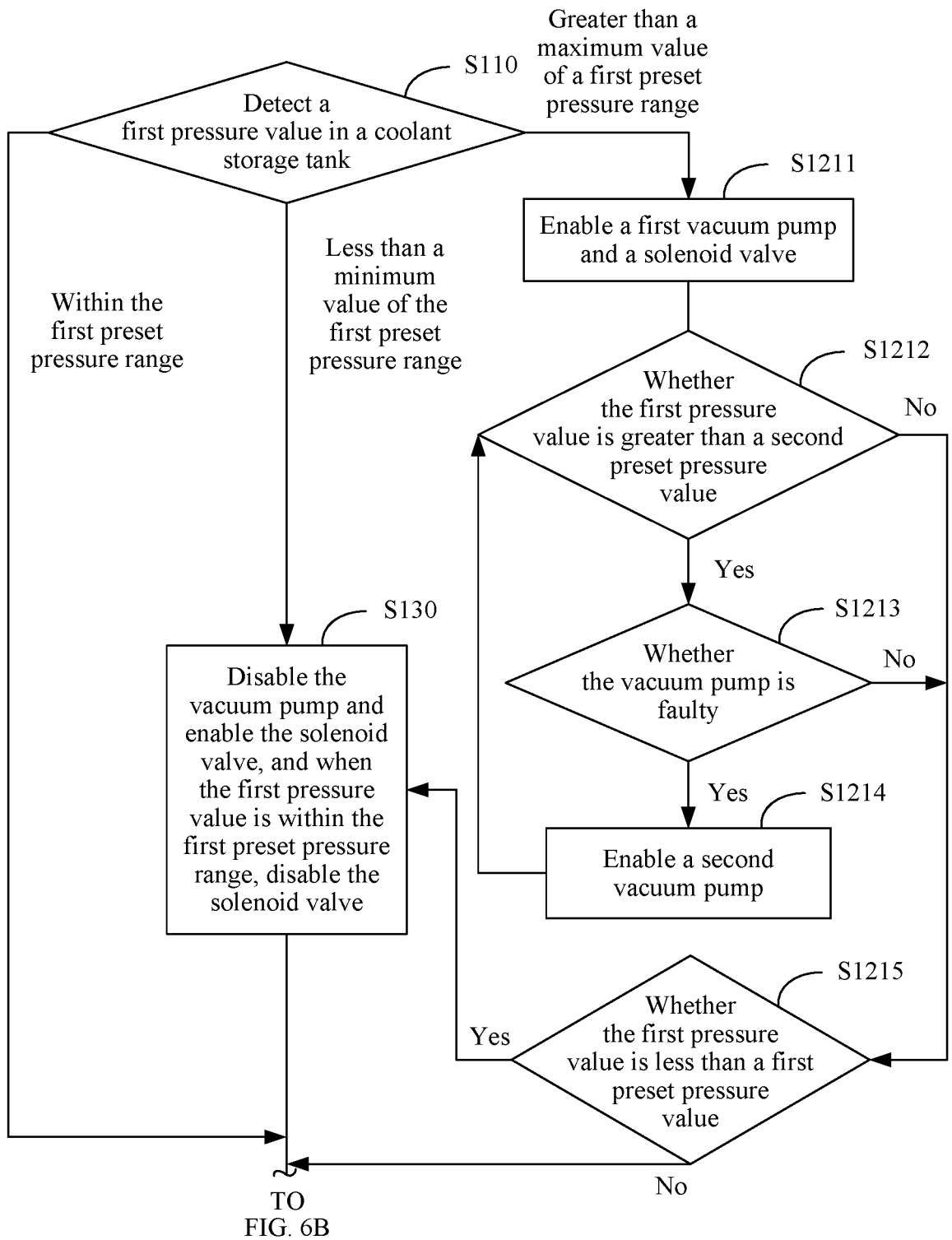
FIG. 6A and FIG. 6B are a flowchart of still another method for controlling a negative pressure liquid cooling system according to an embodiment.
Figure 6B:
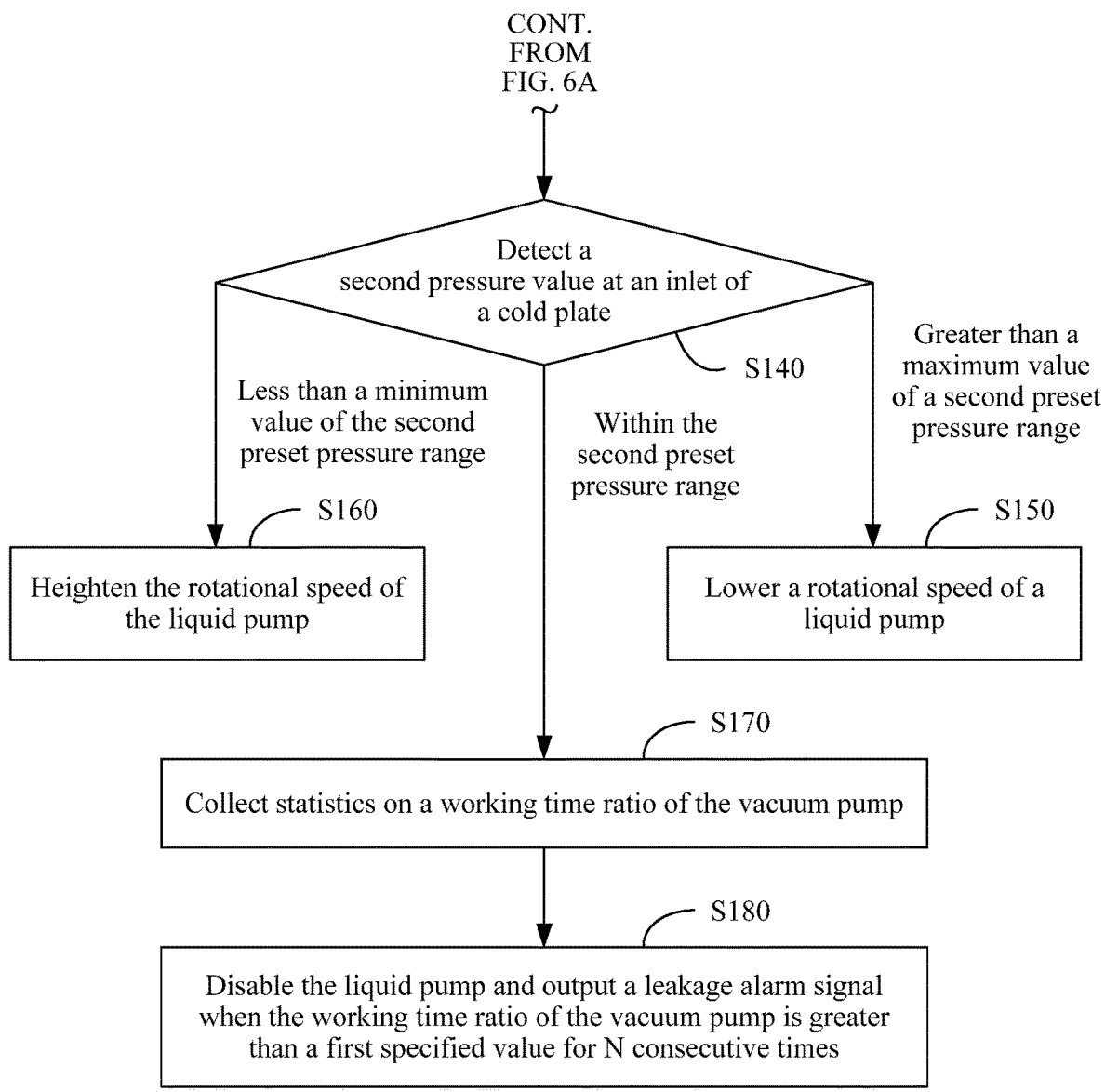

FIG. 6A and FIG. 6B are a flowchart of still another method for controlling a negative pressure liquid cooling system according to an embodiment. The method is applied to the negative pressure liquid cooling system shown in FIG. 3. After it is detected that a currently-run vacuum pump is faulty, a standby vacuum pump is used. As shown in FIG. 6A and FIG. 6B, S120 in FIG. 4 is replaced with the following steps in this method.

S1211. Enable a first vacuum pump and a solenoid valve.

S1212. After the first vacuum pump is enabled for first preset duration, detect whether a current first pressure value in a coolant storage tank is greater than a second preset pressure value; and if yes, perform S1213, or if no, perform S1215.

S1213. Detect whether the first vacuum pump is faulty; and if yes, perform S1214, or if no, perform S1215.

S1214. Enable a second vacuum pump, and go back to perform S1212 after the second vacuum pump is enabled for the first preset duration.

S1215. Detect whether the current first pressure value in the coolant storage tank is greater than a first preset pressure value; and if yes, perform S130, or if no, perform S140.

In one embodiment, the standby vacuum pump is enabled after it is detected that the currently-run vacuum pump is faulty, so that the negative pressure liquid cooling system remains in a negative pressure state, and a leakage risk of the system is reduced.

Figure 7:
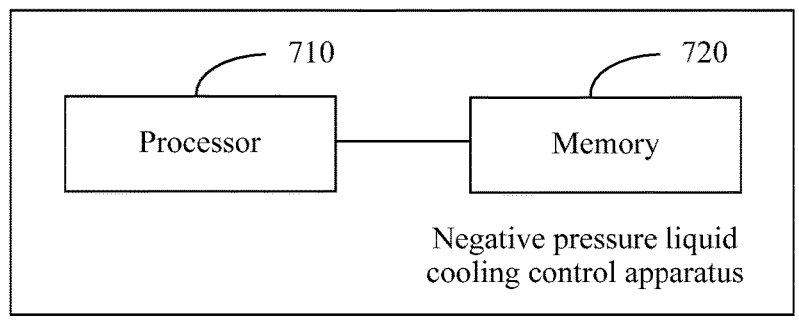
FIG. 7 is a block diagram of a negative pressure liquid cooling control apparatus according to an embodiment.

FIG. 7 is a block diagram of an apparatus for controlling a negative pressure liquid cooling system according to an embodiment. The apparatus includes a processor 710 and a memory 720. The memory 720 may include a non-persistent memory, a random access memory (RAM) and/or a non-volatile memory, and the like in a computer readable medium, for example, a read-only memory (ROM) or a flash memory (flash RAM). The memory includes at least one storage chip.

The memory 720 stores a program instruction, and the processor 710 executes the stored instruction in the memory 720 to implement the following functional steps:

detecting a first pressure value in a coolant storage tank; and enabling the vacuum pump and the solenoid valve when the first pressure value is greater than a second preset pressure value until the first pressure value is decreased to the first preset pressure range, where the second preset pressure value is a maximum value of the first preset pressure range, a minimum value of the first preset pressure range is a first preset pressure value, and both the first preset pressure value and the second preset pressure value are less than one standard atmosphere;

disabling the vacuum pump and enabling the solenoid valve when the first pressure value is less than the first preset pressure value until the first pressure value is increased to the first preset pressure range; or regulating a rotational speed of the liquid pump when the first pressure value is within the first preset pressure range and a second pressure value at an inlet of the cold plate is not within a second preset pressure range, so that the second pressure value remains within the second preset pressure range, where a minimum value of the second preset pressure range is a third preset pressure value, a maximum value of the second preset pressure range is a fourth preset pressure range, both the third preset pressure value and the fourth preset pressure value are less than one standard atmosphere, and the third preset pressure value is greater than the second preset pressure value.

In one embodiment, the following steps are further included:

collecting statistics on a working time ratio of the vacuum pump when the second pressure value is within the second preset pressure range, where the working time ratio is a ratio of an enabling time to a disabling time of the vacuum pump; and disabling the liquid pump when the working time ratio of the vacuum pump is greater than a first specified value for a preset quantity of consecutive times.

In another embodiment, after the enabling the vacuum pump and the solenoid valve when the first pressure value is greater than a second preset pressure value, the method further includes:

after the vacuum pump is enabled for first preset duration, if it is detected that the first pressure value in the coolant storage tank is greater than the second preset pressure value, detecting whether the vacuum pump is faulty; and regulating the rotational speed of the liquid pump if it is detected that the vacuum pump is faulty, so that a difference between the second pressure value and the first pressure value is equal to a fifth preset pressure value, where the fifth preset pressure value is greater than 0.

In another embodiment, the negative pressure liquid cooling system further includes a standby vacuum pump connected to the solenoid valve, and after the enabling the vacuum pump and the solenoid valve when the first pressure value is greater than a second preset pressure value, the method further includes:

after the vacuum pump is enabled for first preset duration, if it is detected that the first pressure value in the coolant storage tank is greater than the second preset pressure value, detecting whether the vacuum pump is faulty; and enabling the standby vacuum pump if it is detected that the vacuum pump is faulty.

In another embodiment, the regulating a rotational speed of the liquid pump, so that the second pressure value is within the second preset pressure range includes:

when the second pressure value is greater than the fourth preset pressure value, decreasing the rotational speed of the liquid pump to decrease the second pressure value; or when the second pressure value is less than the third preset pressure value, increasing the rotational speed of the liquid pump to increase the second pressure value.

In one embodiment, a controller separately controls the inlet and an outlet of the cold plate to ensure that both the inlet and the outlet of the cold plate are in a negative pressure. In this way, when a pipeline between the inlet and the outlet of the cold plate in the negative pressure liquid cooling system is perforated, the controller can separately control the rotational speed of the liquid pump and the vacuum pump, to return the inlet and the outlet of the cold plate to a negative pressure, so that a coolant is suppressed in the pipeline, and a coolant leakage phenomenon is avoided. In addition, a one-way valve is disposed between an outlet of a second loop of a heat exchanger and the inlet of the cold plate, an inlet of the one-way valve is connected to the heat exchanger, and an outlet of the one-way valve is connected to the cold plate. When a pipeline connected to the inlet of the cold plate is perforated, a pressure at the perforation increases, a pressure at the outlet of the one-way valve is greater than a pressure at the inlet of the one-way valve, the one-way valve is disabled, and a water flow is rapidly blocked, to save time for the controller to control the liquid pump to regulate a speed, thereby ensuring that a pressure at the inlet of the cold plate is returned to the second preset pressure range.

This application provides a processor, configured to run a program, and when the program runs, the processor performs the method for controlling a negative pressure liquid cooling system.

All or some of the foregoing embodiments may be implemented through software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to the embodiments of the present disclosure are all or partially generated. The computer may be a general-purpose computer, a dedicated computer, a computer network, or another programmable apparatus. The computer instructions may be stored in a computer readable storage medium or may be transmitted from a computer readable storage medium to another computer readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state drive Solid State Disk (SSD)), or the like.

It should be noted that, to make the description brief, the foregoing method embodiments are expressed as a series of actions. However, a person skilled in the art should appreciate that the present disclosure is not limited to the described action sequence, because according to the present disclosure, some steps may be performed in other sequences or performed simultaneously. In addition, a person skilled in the art should also appreciate that all the embodiments described in the specification are example embodiments, and the related actions and modules are not necessarily mandatory to the present disclosure.

It should be noted that the embodiments in this specification are all described in a progressive manner, each embodiment focuses on a difference from other embodiments, and for same or similar parts in the embodiments, refer to these embodiments. An apparatus embodiment is basically similar to a method embodiment, and therefore is described briefly. For related parts, refer to partial descriptions in the method embodiment.

In the end, it should be noted that in this specification, relational terms such as first and second are only used to distinguish one entity or operation from another, and do not necessarily require or imply that any actual relationship or sequence exists between these entities or operations. Moreover, the terms "include", "include", or their any other variant is intended to cover a non-exclusive inclusion, so that a process, a method, an article, or a device that includes a list of elements not only includes those elements but also includes other elements that are not expressly listed, or further includes elements inherent to such a process, method, article, or device. An element preceded by "includes a . . . " does not, without more constraints, preclude the presence of additional identical elements in the process, method, article, or device that includes the element.

The embodiments disclosed above are described to enable a technical person skilled in the art to implement or use the present disclosure. Various modifications to the embodiments are obvious to the technical person skilled in the art, and general principles defined in this specification may be implemented in other embodiments without departing from the spirit or scope of the present disclosure. Therefore, the present disclosure will not be limited to the embodiments described in this specification but extends to the widest scope that complies with the principles and novelty disclosed in this specification.

The foregoing descriptions are merely example embodiments of the present disclosure. It should be noted that a person of ordinary skill in the art may make several improvements or polishing without departing from the principle of the present disclosure and the improvements or polishing shall fall within the protection scope of the present disclosure.

What is claimed is:

1. A method for controlling a negative pressure liquid cooling system comprising a cold plate, a coolant storage tank, a vacuum pump, a solenoid valve, a liquid pump, and a heat exchanger, wherein the cold plate is configured to cool a to-be-cooled device, the coolant storage tank is connected to an outlet of the cold plate, the vacuum pump is connected to the coolant storage tank through the solenoid valve, an inlet of the liquid pump is connected to the coolant storage tank, the heat exchanger comprises a first loop and a second loop that are mutually isolated, a fluid in the first loop is used to cool a fluid in the second loop, an inlet of the second loop is connected to an outlet of the liquid pump, and an outlet of the second loop is connected to an inlet of the cold plate, the method comprising:

detecting a first pressure value in the coolant storage tank;

enabling the vacuum pump and the solenoid valve when the first pressure value is greater than a second preset pressure value until the first pressure value is decreased to a first preset pressure range, wherein the second preset pressure value is a maximum value of the first preset pressure range, a minimum value of the first preset pressure range is a first preset pressure value, and both the first preset pressure value and the second preset pressure value are less than one standard atmosphere; and (a) disabling the vacuum pump and enabling the solenoid valve when the first pressure value is less than the first preset pressure value until the first pressure value is increased to the first preset pressure range; or (b) regulating a rotational speed of the liquid pump when the first pressure value is within the first preset pressure range and a second pressure value at the inlet of the cold plate is not within a second preset pressure range, so that the second pressure value at the inlet of the cold plate remains within the second preset pressure range, wherein a minimum value of the second preset pressure range is a third preset pressure value, a maximum value of the second preset pressure range is a fourth preset pressure value, both the third preset pressure value and the fourth preset pressure value are less than one standard atmosphere, and the third preset pressure value is greater than the second preset pressure value.

2. The method according to claim 1, further comprising:

collecting statistics on a working time ratio of the vacuum pump when the second pressure value is within the second preset pressure range, wherein the working time ratio is a ratio of an enabling time to a disabling time of the vacuum pump; and disabling the liquid pump when the working time ratio of the vacuum pump is greater than a first specified value for a preset quantity of consecutive times.

3. The method according to claim 1, further comprising:

after enabling the vacuum pump and the solenoid valve when the first pressure value is greater than the second preset pressure value, after the vacuum pump is enabled for a first preset duration, if it is detected that the first pressure value in the coolant storage tank is greater than the second preset pressure value, detecting whether the vacuum pump is faulty; and regulating the rotational speed of the liquid pump if it is detected that the vacuum pump is faulty, so that a difference between the second pressure value and the first pressure value is equal to a fifth preset pressure value that is greater than 0.

4. The method according to claim 1,
wherein the negative pressure liquid cooling system further comprises a standby vacuum pump connected to the solenoid valve, and
further comprising: after enabling the vacuum pump and the solenoid valve when the first pressure value is greater than a second preset pressure value,
after the vacuum pump is enabled for a first preset duration, if it is detected that the first pressure value in the coolant storage tank is greater than the second preset pressure value, detecting whether the vacuum pump is faulty; and
enabling the standby vacuum pump if it is detected that the vacuum pump is faulty.

5. The method according to claim 1, wherein regulating the rotational speed of the liquid pump comprises:
when the second pressure value is greater than the fourth preset pressure value, decreasing the rotational speed of the liquid pump to decrease the second pressure value; or
when the second pressure value is less than the third preset pressure value, increasing the rotational speed of the liquid pump to increase the second pressure value.

6. A negative pressure liquid cooling system, comprising:
a vacuum pump;
a solenoid valve;
a liquid pump;
a cold plate laminated to a to-be-cooled electronic device, and configured to cool the to-be-cooled electronic device;
a coolant storage tank, wherein an inlet of the coolant storage tank is connected to an outlet of the cold plate, and an outlet of the coolant storage tank is connected to an inlet of the liquid pump;
a heat exchanger comprising a first loop and a second loop that are mutually isolated, a fluid in the first loop is used to cool a fluid in the second loop, an inlet of the second loop is connected to an outlet of the liquid pump, and an outlet of the second loop is connected to an inlet of the cold plate; and
a controller configured to: control, by controlling working statuses of the vacuum pump and the solenoid valve, a first pressure value in the coolant storage tank to remain within a first preset pressure range; and control, by controlling a rotational speed of the liquid pump, a second pressure value at the inlet of the cold plate to remain within a second preset pressure range, wherein all pressures in the first preset pressure range and the second preset pressure range are less than one standard atmosphere, and a minimum value of the second preset pressure range is greater than a maximum value of the first preset pressure range.

7. The system according to claim 6, wherein to control the first pressure value and the second pressure value, the controller is configured to:
detect the first pressure value;
enable the vacuum pump and the solenoid valve when the first pressure value is greater than a second preset pressure value until the first pressure value is decreased to the first preset pressure range, wherein the second preset pressure value is the maximum value of the first preset pressure range, a minimum value of the first preset pressure range is a first preset pressure value, and both the first preset pressure value and the second preset pressure value are less than one standard atmosphere; and
(a) disable the vacuum pump and enable the solenoid valve when the first pressure value is less than the first preset pressure value until the first pressure value is within the first preset pressure range; or
(b) when the first pressure value is within the first preset pressure range and the second pressure value is not within the second preset pressure range, control, by controlling the rotational speed of the liquid pump, the second pressure value to remain within the second preset pressure range.

8. The system according to claim 7, wherein the controller is further configured to:
collect statistics on a working time ratio of the vacuum pump when the second pressure value is within the second preset pressure range, wherein the working time ratio is a ratio of an enabling time to a disabling time of the vacuum pump; and
disable the liquid pump when the working time ratio of the vacuum pump is greater than a first specified value for a preset quantity of consecutive times.

9. The system according to claim 7, wherein the controller is further configured to:
after the vacuum pump is enabled for a first preset duration, if it is detected that the first pressure value in the coolant storage tank is greater than the second preset pressure value, detect whether the vacuum pump is faulty; and
regulate the rotational speed of the liquid pump if it is detected that the vacuum pump is faulty, so that a difference between the second pressure value and the first pressure value is equal to a fifth preset pressure value, wherein the fifth preset pressure value is greater than 0.

10. The system according to claim 6, wherein
the minimum value of the second preset pressure range is a third preset pressure value, a maximum value of the second preset pressure range is a fourth preset pressure value, and both the third preset pressure value and the fourth preset pressure value are less than one standard atmosphere; and
when controlling, by controlling the rotational speed of the liquid pump, the second pressure value to remain within the second preset pressure range, the controller is configured to:
decrease the rotational speed of the liquid pump when the second pressure value is greater than the fourth preset pressure value, so that the second pressure value is less than the fourth preset pressure value; or
increase the rotational speed of the liquid pump when the second pressure value is less than the third preset pressure value, so that the second pressure value is greater than the third preset pressure value.

11. A device for controlling a negative pressure liquid cooling system comprising a cold plate, a coolant storage tank, a vacuum pump, a solenoid valve, a liquid pump, and a heat exchanger, wherein the cold plate is configured to cool a to-be-cooled device, the coolant storage tank is connected to an outlet of the cold plate, the vacuum pump is connected to the coolant storage tank through the solenoid valve, an inlet of the liquid pump is connected to the coolant storage tank, the heat exchanger comprises a first loop and a second loop that are mutually isolated, a fluid in the first loop is used to cool a fluid in the second loop, an inlet of the second loop is connected to an outlet of the liquid pump, and an outlet of the second loop is connected to an inlet of the cold plate, the device comprising:

a processor and a memory storing program instructions, which when executed by the processor, cause the processor to perform a method for controlling the negative pressure liquid cooling system, the method comprising:

detecting a first pressure value in the coolant storage tank;

enabling the vacuum pump and the solenoid valve when the first pressure value is greater than a second preset pressure value until the first pressure value is decreased to a first preset pressure range, wherein the second preset pressure value is a maximum value of the first preset pressure range, a minimum value of the first preset pressure range is a first preset pressure value, and both the first preset pressure value and the second preset pressure value are less than one standard atmosphere; and (a) disabling the vacuum pump and enabling the solenoid valve when the first pressure value is less than the first preset pressure value until the first pressure value is increased to the first preset pressure range; or (b) regulating a rotational speed of the liquid pump when the first pressure value is within the first preset pressure range and a second pressure value at the inlet of the cold plate is not within a second preset pressure range, so that the second pressure value at the inlet of the cold plate remains within the second preset pressure range, wherein a minimum value of the second preset pressure range is a third preset pressure value, a maximum value of the second preset pressure range is a fourth preset pressure value, both the third preset pressure value and the fourth preset pressure value are less than one standard atmosphere, and the third preset pressure value is greater than the second preset pressure value.

12. The device according to claim 11, wherein the method further comprises:

collecting statistics on a working time ratio of the vacuum pump when the second pressure value is within the second preset pressure range, wherein the working time ratio is a ratio of an enabling time to a disabling time of the vacuum pump; and disabling the liquid pump when the working time ratio of the vacuum pump is greater than a first specified value for a preset quantity of consecutive times.

13. The device according to claim 11, wherein the method further comprises: after enabling the vacuum pump and the solenoid valve when the first pressure value is greater than the second preset pressure value, after the vacuum pump is enabled for a first preset duration, if it is detected that the first pressure value in the coolant storage tank is greater than the second preset pressure value, detecting whether the vacuum pump is faulty; and regulating the rotational speed of the liquid pump if it is detected that the vacuum pump is faulty, so that a difference between the second pressure value and the first pressure value is equal to a fifth preset pressure value, wherein the fifth preset pressure value is greater than 0.

14. The device according to claim 11, wherein the negative pressure liquid cooling system further comprises a standby vacuum pump connected to the solenoid valve, and the method further comprises: after the enabling the vacuum pump and the solenoid valve when the first pressure value is greater than a second preset pressure value, after the vacuum pump is enabled for first preset duration, if it is detected that the first pressure value in the coolant storage tank is greater than the second preset pressure value, detecting whether the vacuum pump is faulty; and enabling the standby vacuum pump if it is detected that the vacuum pump is faulty.

15. The device according to claim 11, wherein regulating the rotational speed of the liquid pump comprises:

when the second pressure value is greater than the fourth preset pressure value, decreasing the rotational speed of the liquid pump to decrease the second pressure value; or when the second pressure value is less than the third preset pressure value, increasing the rotational speed of the liquid pump to increase the second pressure value.

* * * * *